United States Patent
Chen et al.

(10) Patent No.: US 6,756,265 B2
(45) Date of Patent: Jun. 29, 2004

(54) METHODS OF FORMING A CAPACITOR STRUCTURE

(75) Inventors: Shenlin Chen, Boise, ID (US); Er-Xuan Ping, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/302,626

(22) Filed: Nov. 21, 2002

(65) Prior Publication Data

US 2003/0075754 A1 Apr. 24, 2003

Related U.S. Application Data

(62) Division of application No. 10/075,193, filed on Feb. 13, 2002, which is a division of application No. 09/933,913, filed on Aug. 20, 2001, now Pat. No. 6,458,652.

(51) Int. Cl.⁷ .......................................... H01L 21/8242
(52) U.S. Cl. ....................... 438/253; 438/255; 438/396
(58) Field of Search ................................ 438/253–255, 438/396–398, 964; 207/306, 309

(56) References Cited

U.S. PATENT DOCUMENTS

| 5,418,180 A | 5/1995 | Brown |
| 5,661,064 A | * 8/1997 | Figure et al. ............... 438/396 |
| 6,046,093 A | 4/2000 | DeBoer et al. |
| 6,111,285 A | 8/2000 | Al-Shareef et al. |
| 6,127,239 A | 10/2000 | Jost et al. |
| 6,180,485 B1 | 1/2001 | Parekh et al. |
| 6,255,159 B1 | * 7/2001 | Thakur ........................ 438/253 |
| 6,274,428 B1 | 8/2001 | Wu |
| 6,312,986 B1 | 11/2001 | Hermes |
| 6,451,661 B1 | 9/2002 | DeBoer et al. |
| 2001/0002053 A1 | 5/2001 | Kwok et al. |
| 2002/0004272 A1 | 1/2002 | Li et al. |

* cited by examiner

*Primary Examiner*—Carl Whitehead, Jr.
*Assistant Examiner*—Yennhu B Huynh
(74) *Attorney, Agent, or Firm*—Wells St. John P.S.

(57) ABSTRACT

The invention includes a method of forming a capacitor electrode. A sacrificial material sidewall is provided to extend at least partially around an opening. A first silicon-containing material is formed within the opening to partially fill the opening, and is doped with conductivity-enhancing dopant. A second silicon-containing material is formed within the partially filled opening, and is provided to be less heavily doped with conductivity-enhancing dopant than is the first silicon-containing material. At least some of the second silicon-containing material is converted into hemispherical grain silicon, and at least some of the sacrificial material sidewall is removed. The invention also encompasses methods of forming capacitors and capacitor assemblies incorporating the above-described capacitor electrode. Further, the invention encompasses capacitor assemblies and capacitor structures.

12 Claims, 8 Drawing Sheets

METHODS OF FORMING A CAPACITOR STRUCTURE

CROSS REFERENCE TO RELATED APPLICATIONS

This patent resulted from a divisional application of U.S. patent application Ser. No. 10/075,193, filed on Feb. 13, 2002, which is a divisional application of U.S. patent application Ser. No. 09/933,913, which was filed on Aug. 20, 2001 U.S. Pat. No. 6,458,652.

TECHNICAL FIELD

The invention pertains to methods of forming semiconductor structures, and in particular embodiments pertains to methods of forming capacitor electrodes and capacitor assemblies. The invention also encompasses capacitor structures, and capacitor-containing assemblies.

BACKGROUND OF THE INVENTION

Capacitors are utilized in numerous semiconductor structures. For instance, capacitors can be coupled with transistors to form dynamic random access memory (DRAM) cells. A continuing goal in semiconductor device fabrication is to shrink the spacing between adjacent devices, and therefore enable an increasing number of devices to be formed within the same amount of semiconductor wafer real estate. A problem that can occur when spacing between adjacent capacitor structures is reduced is that various conductive components of the adjacent structures can extend across a gap between the structures, and ultimately cause an electrical short from one structure to an adjacent structure. Such electrical short can alter electrical characteristics associated with the capacitor structures, and even render the structures inoperable.

It would be desirable to develop new capacitor structures designed for relatively tight packing between adjacent structures; and it would be further desirable to develop methodologies for forming such structures.

SUMMARY OF THE INVENTION

In one aspect, the invention encompasses a method of forming a capacitor electrode. A sacrificial material sidewall is provided to extend at least partially around an opening. A first silicon-containing material is formed within the opening to partially fill the opening, and is doped with conductivity-enhancing dopant. A second silicon-containing material is formed within the partially filled opening, and is provided to be less heavily doped with conductivity-enhancing dopant than is the first silicon-containing material. At least some of the second silicon-containing material is converted into hemispherical grain silicon, and at least some of the sacrificial material sidewall is removed. The invention also encompasses methods of forming capacitors and capacitor assemblies incorporating the above-described capacitor electrode. Further, the invention encompasses capacitor assemblies and capacitor structures.

An exemplary capacitor structure encompassed by the invention comprises a container construction which includes a first silicon-containing layer around a second silicon-containing layer. The second silicon-containing layer defines an inner periphery of the container and the first silicon-containing defines an outer periphery of the container. At least some of the second silicon-containing layer is in the form of hemispherical grain silicon. A dielectric material is along the inner and outer peripheries of the container construction, and a conductive material is over the dielectric material. The container construction, dielectric material and conductive material together define at least part of the capacitor structure.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
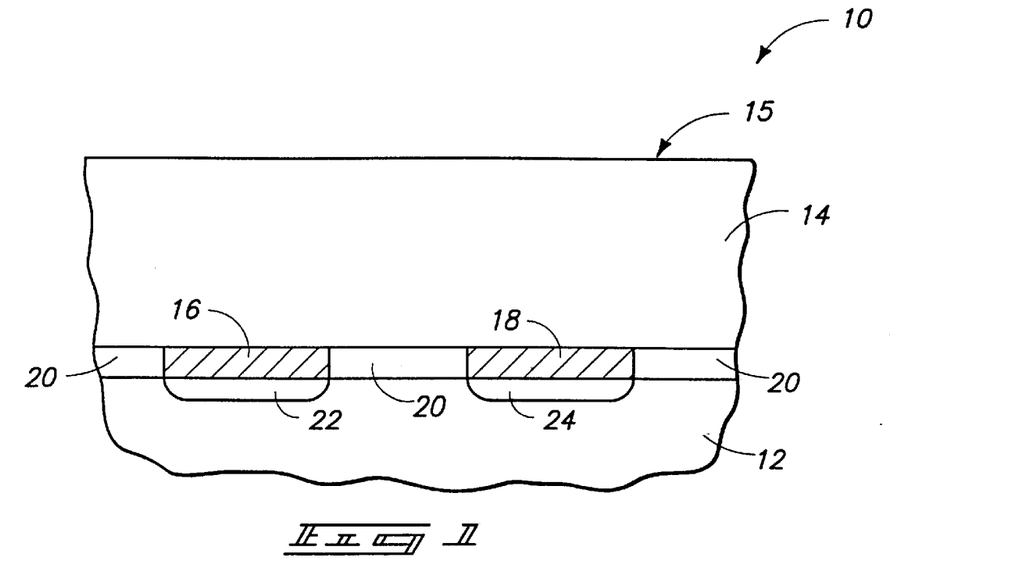
FIG. 1 is a diagrammatic, cross-sectional view of a semiconductor wafer fragment shown at a preliminary processing step of a method of the present invention.

A first embodiment method of the present invention is described with reference to FIGS. 1–8. Referring initially to FIG. 1, a semiconductor wafer fragment 10 comprises a substrate 12 having an insulative mass 14 thereover. Mass 14 has an upper surface 15.

Substrate 12 can comprise, for example, monocrystalline silicon, and insulative mass 14 can comprise, for example, borophosphosilicate glass (BPSG).

To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Even though material 12 is referred to above as a "substrate" it is to be understood that the term "substrate" can also be utilized in the context of this disclosure to refer to mass 14, or to refer to the assembly comprising a combination of masses 12 and 14. For purposes of describing FIGS. 1–8, mass 12 will be referred to as a "substrate." However, it is to be understood that the term "substrate" utilized in the claims that follow can encompass other materials in combination with, or alternatively to, mass 12.

A pair of electrical nodes 16 and 18 are supported by substrate 12. In the shown construction, an insulative mass 20 is provided between substrate 12 and mass 14; and electrical nodes 16 and 18 are conductive plugs extending through insulative mass 20. Insulative mass 20 could comprise, for example, BPSG, silicon dioxide, or silicon nitride. Plugs 16 and 18 can comprise, for example, metals (such as tungsten or titanium); metal nitrides (such as, for example, tungsten nitride or titanium nitride); metal silicides (such as, for example, tungsten silicide or titanium silicide) and/or conductively-doped silicon (such as, for example, conductively-doped polycrystalline silicon).

Plugs 16 and 18 are shown formed over conductively-doped diffusion regions 22 and 24 which extend into substrate 12. Diffusion regions 22 and 24 can comprise either n-type dopant or p-type dopant. Diffusion regions 22 and 24 can correspond to source/drain regions associated with transistor devices (not shown). In alternative embodiments of the invention, conductive plugs 16 and 18 can be omitted, together with mass 20; and mass 14 can be formed directly over substrate 12 and diffusion regions 22 and 24. In yet other alternative embodiments, diffusion regions 22 and 24 can be ommited, and conductive plugs 16 and 18 can be in electrical connection with other circuitry (not shown) supported by substrate 12.

Ultimately, the processing of FIGS. 1–8 forms capacitor constructions in electrical connection with conductive plugs 16 and 18, and plugs 16 and 18 accordingly provide electrical interconnection between the capacitor constructions and other circuitry (not shown) associated with substrate 12. If plugs 16 and 18 are omitted, the capacitor constructions can be formed in electrical contact with diffusion regions 22 and 24 without the intervening plugs 16 and 18.

Figure 2:
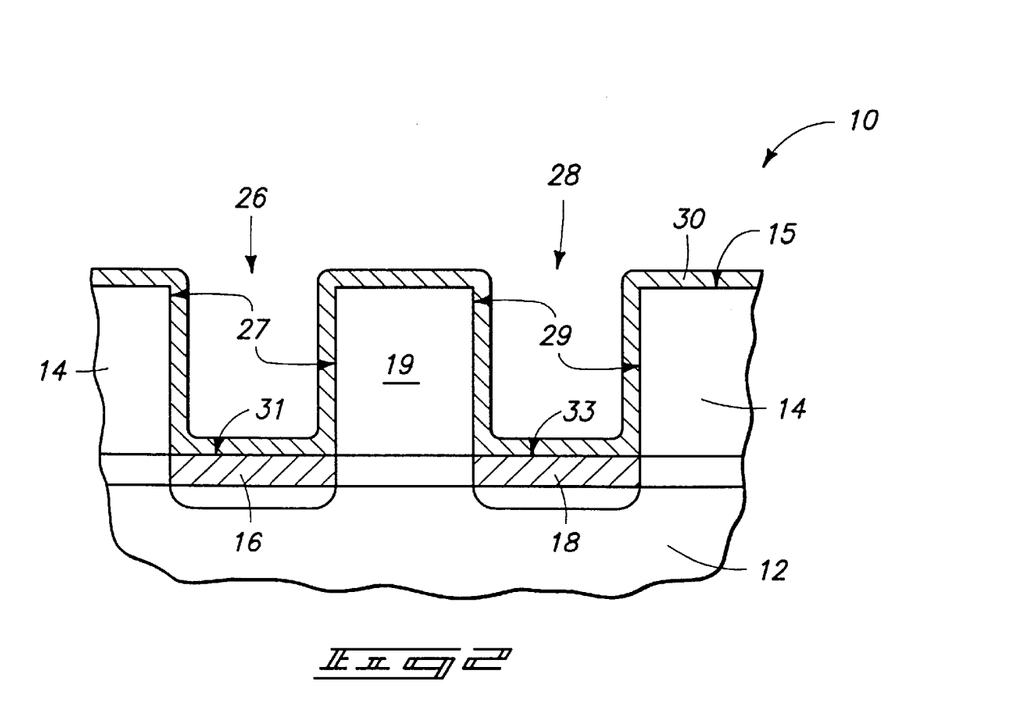
FIG. 2 is a view of the FIG. 1 wafer fragment shown at a processing step subsequent to that of FIG. 1.

Referring to FIG. 2, openings 26 and 28 are formed through insulative mass 14 and to electrical nodes 16 and 18, respectively. The openings have sidewall peripheries 27 and 29, respectively; and bottom peripheries 31 and 33, respectively.

A conductive material layer 30 is formed across upper surface 15 of insulative material 14, and is formed within openings 26 and 28 to partially fill the openings. Layer 30 can be referred to as a first layer formed within the openings. In the processing that follows, a substantial amount of material 30 will ultimately be removed. Accordingly, material 30 can also be referred to as a sacrificial material. Material 30 preferably comprises a metal and/or a metal nitride; and in particular embodiments can comprise one or more materials selected from the group consisting of elemental titanium, elemental tungsten, titanium nitride, and tungsten nitride. In other particular embodiments, material 30 can consist of, or consist essentially of, one or more materials selected from the group consisting of elemental titanium, elemental tungsten, titanium nitride, and tungsten nitride.

Figure 3:
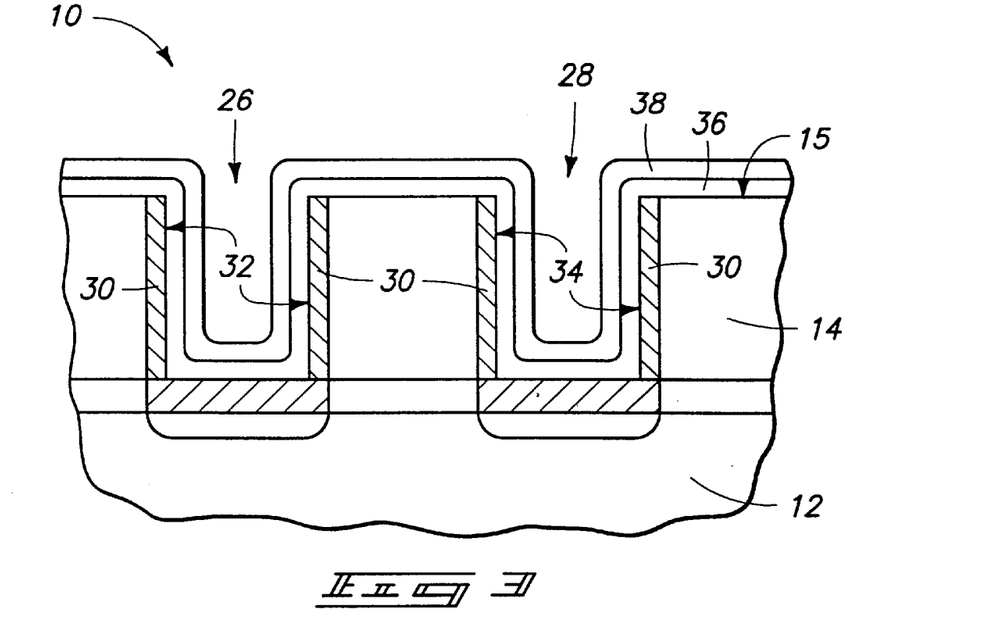
FIG. 3 is a view of the FIG. 1 wafer fragment shown at a processing step subsequent to that of FIG. 2.

Referring to FIG. 3, wafer fragment 10 is illustrated after material 30 has been subjected to an anisotropic etch which removes material 30 from over upper surface 15 of mass 14, and further removes material 30 from the majority of the bottom peripheries of openings 26 and 28. The remaining portions of material 30 within openings 26 and 28 define sidewall spacers 32 and 34 within openings 26 and 28, respectively. In other words, the material 30 remaining within openings 26 and 28 extends at least partially around sidewalls of the openings, but does not extend across a majority of the bottom peripheries of the openings. A suitable anisotropic etch is a plasma dry etch. In embodiments in which material 30 comprises tungsten, titanium, tungsten nitride or titanium nitride; a suitable dry etch can be conducted at a plasma power of from 100 watts to 500 watts, for a time of from 10 seconds to 60 seconds, under a pressure of from 10 mTorr to 2 Torr, at a temperature of from 30° C. to 100° C., with an etchant comprising $Cl_2$-based chemistry Preferably, metal layer 30 will have a thickness of from about 50 Å to about 200 Å, which can enable a sufficient thickness of material 30 to provide desired support properties, while also being sufficiently thin to enable the plasma etch to be conducted in a reasonable period of time.

A first silicon-containing layer 36 is provided over insulative mass 14 and within openings 26 and 28 to partially fill, and accordingly narrow the openings; and a second silicon-containing layer 38 is provided over layer 36 and within the narrowed openings. First silicon-containing layer 36 and second silicon-containing layer 38 can be referred to herein as a second layer and a third layer, respectively, to indicate that the layers follow provision of sacrificial layer 30.

Silicon-containing layers 36 and 38 can comprise one or both of amorphous silicon and polycrystalline silicon. Layer 36 is doped with conductivity-enhancing dopant, and is substantially more doped with conductivity-enhancing dopant than is silicon-containing layer 38. The conductivity-enhancing dopant within layer 36 can be n-type. Preferably, the conductivity-enhancing dopant concentration within layer 36 will be at least $10^{20}$ atoms/cm$^3$. Also, the dopant concentration within silicon-containing layer 36 will preferably be at least $10^3$ fold higher than any dopant concentration in second silicon-containing layer 38, more preferably at least $10^5$ fold higher than any dopant concentration in silicon-containing layer 38; and even more preferably at least $10^{10}$ fold higher than any dopant concentration in silicon-containing layer 38. In particular embodiments, first silicon-containing layer 36 can be doped to a concentration of greater than or equal to $10^{20}$ atoms/cm$^3$ with conductivity-enhancing dopant, and second silicon-containing layer 38 is substantially undoped with conductivity-enhancing dopant silicon. The term "substantially undoped" is defined herein to refer to a dopant concentration of less than $10^{15}$ atoms/cm$^3$.

Figure 4:
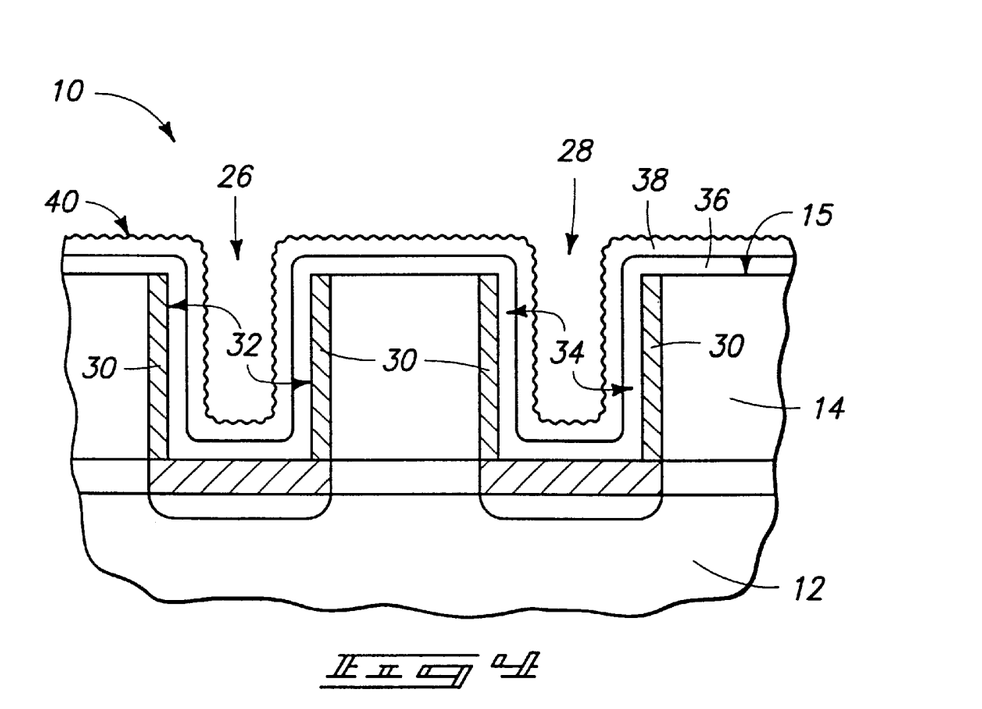
FIG. 4 is a view of the FIG. 1 wafer fragment shown at a processing step subsequent to that of FIG. 3.

Referring to FIG. 4, fragment 10 is illustrated after second silicon-containing layer 38 has been exposed to conditions which roughen an outer surface of the layer to form a rugged surface 40. Rugged surface 40 can be considered to comprise hemispherical grain silicon. Suitable conditions for forming roughened surface 40 are to expose layer 38 to silane gas at a temperature of at least about 550° C. for a time of less than or equal to about two minutes under a vacuum of less than or equal to 1×10⁻⁴ Torr to seed the layer, and subsequently annealing the seeded layer at a temperature of at least about 550° C. for a time of less than or equal to about 3 minutes.

Figure 5:
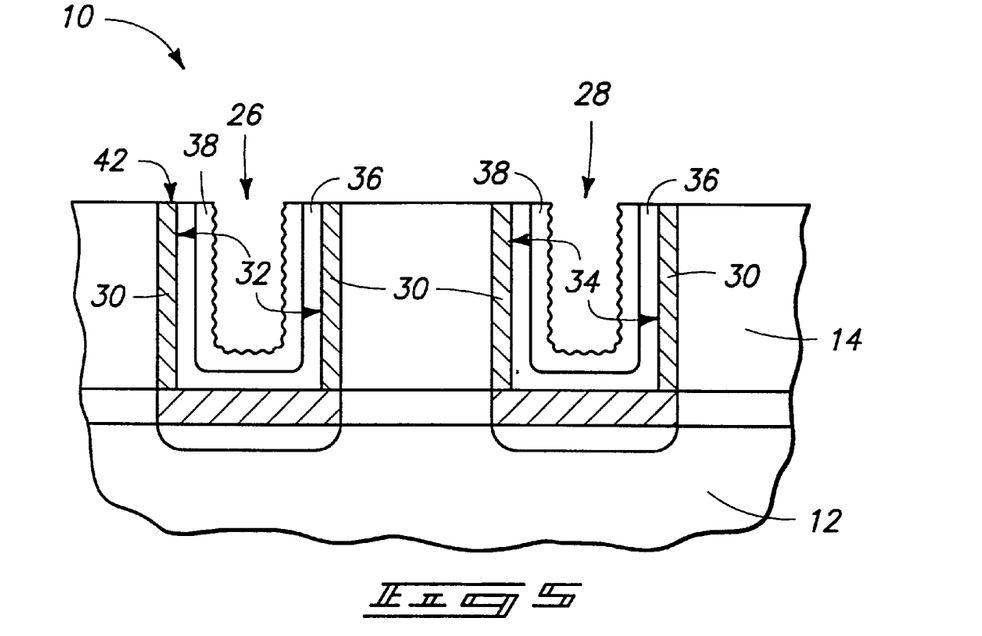
FIG. 5 is a view of the FIG. 1 wafer fragment shown at a processing step subsequent to that of FIG. 4.

Referring to FIG. 5, wafer fragment 10 is illustrated after removal of silicon-containing layers 36 and 38 from over mass 14. Such removal can be accomplished by planarization, such as, for example, chemical-mechanical polishing. In the shown embodiment, planarization has left a substantially flat (i.e., planar) upper surface 42 extending across mass 14, sidewall spacers 32 and 34, and the layers 36 and 38. Upper surface 42 can be at the same elevation as the initial upper surface 15 (FIGS. 1–4) of mass 14, or can be elevationally lower than such initial upper surface if some of mass 14 is removed during the planarization process.

Figure 6:
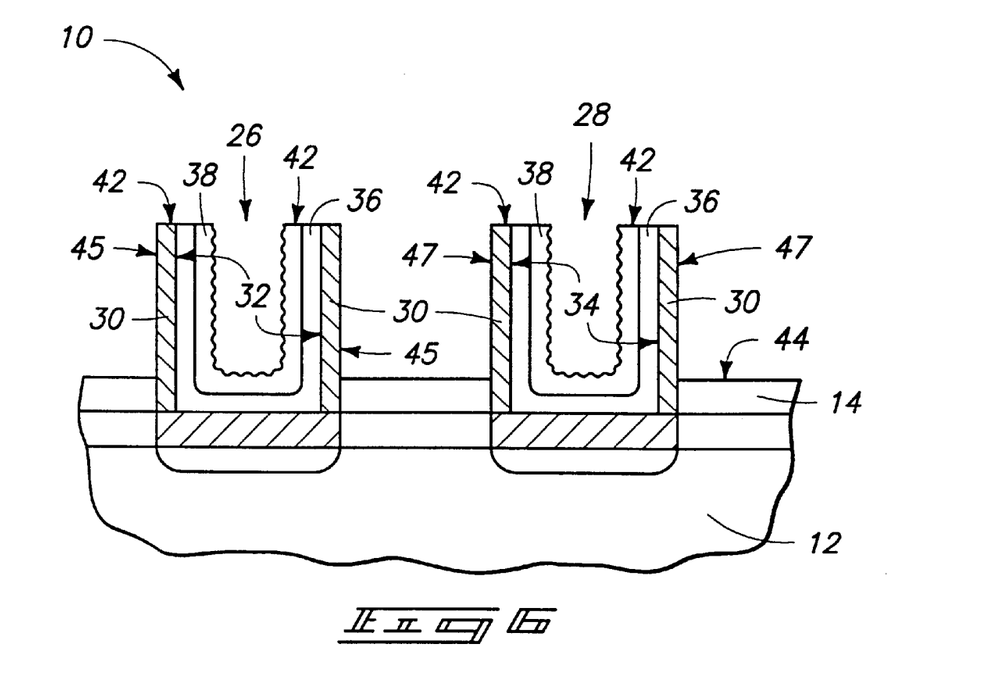
FIG. 6 is a view of the FIG. 1 wafer fragment shown at a processing step subsequent to that of FIG. 5.

Referring to FIG. 6, insulative mass 14 is selectively etched back relative to metal-comprising layer 30 and silicon-containing layers 36 and 38. In embodiments in which silicon-containing layers 36 and 38 comprise amorphous or polycrystalline silicon, metal-containing layer 30 comprises elemental metal or metal nitride, and insulative mass 14 comprises BPSG, a suitable etching process for selectively etching the BPSG of mass 14 is diluted HF at 100:1 or 10:1.

The etch removes some of mass 14 and effectively forms a new upper surface 44 of the mass which is lowered relative to planarized upper surface 42. Also, the removal of a portion of mass 14 exposes outer edges of sidewalls 32 and 34, with such outer edges being labeled as 45 and 47, respectively. In the shown preferred embodiment, only some of mass 14 is removed, and accordingly only portions of the outer edges of spacers 32 and 34 are exposed. However, the invention encompasses other embodiments (not shown) wherein an entirety of mass 14 is removed, and accordingly wherein an entirety of the outer edges of spacers 32 and 34 are exposed.

Figure 7:
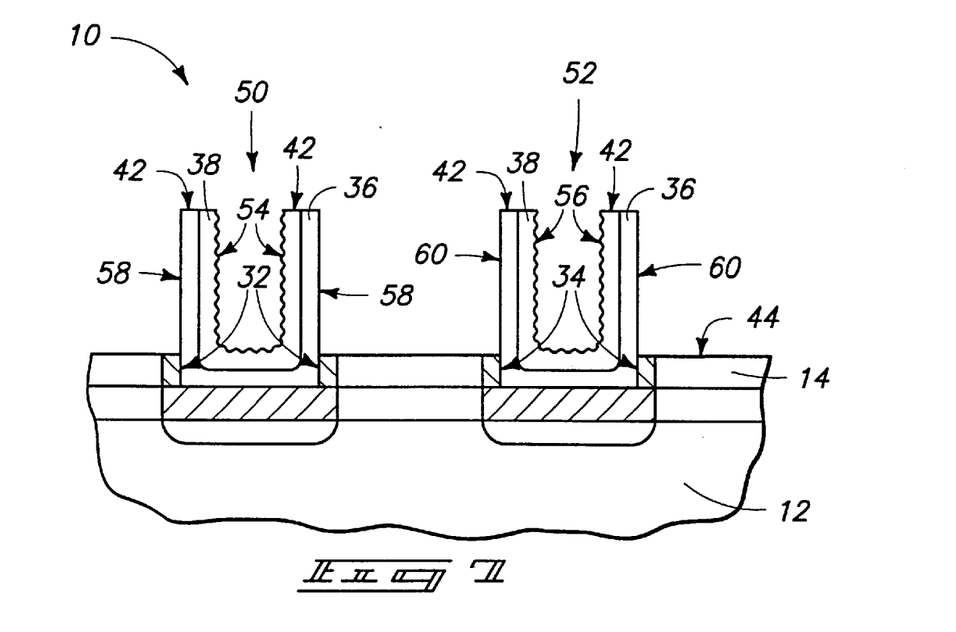
FIG. 7 is a view of the FIG. 1 wafer fragment shown at a processing step subsequent to that of FIG. 6.

Referring to FIG. 7, exposed portions of spacers 32 and 34 are selectively removed relative to silicon-containing layers 36 and 38; and relative to insulative mass 44. In embodiments in which sacrificial material 30 comprises elemental titanium, elemental tungsten, titanium nitride, and/or tungsten nitride; sacrificial mass 44 comprises BPSG; and layers 36 and 38 comprise amorphous and/or polycrystalline silicon; a suitable etch for selectively removing sacrificial material 30 is a pirahna etch. The etch can be extensive enough to create a small trench (not shown), or can leave a surface of material 30 approximately level with the surface of material 14 as shown.

The removal of exposed portions of sacrificial material 30 leaves container-shaped structures 50 and 52 remaining over conductive plugs 16 and 18, respectively. The container-shaped structures comprise an outer silicon-containing layer 36 around an inner silicon-containing layer 38. The inner layer 38 defines inner peripheries 54 and 56 of the container structures, and outer silicon-containing layer 36 defines outer peripheries 58 and 60 of the structures. Inner periphery 54 is roughened relative to outer periphery 58, and in the shown embodiment outer periphery 58 is substantially smooth (i.e., the outer periphery has not been subjected to conditions which form a rugged silicon surface from the silicon of layer 36). Although the shown embodiment has an entirety of the inner periphery 54 shown as rugged or hemispherical grain silicon; it is to be understood that the invention encompasses other embodiments (not shown) wherein only some of the inner periphery 54 is in the form of rugged silicon.

Container structures 50 and 52 ultimately form electrodes (storage nodes) for capacitor structures. The utilization of relatively smooth outer peripheral surfaces 58 and 60 allows the container structures to be formed in close proximity to one another without risk of shorting between the structures; and the rugged inner peripheral surfaces 54 and 56 allow a surface area of the electrodes to be increased relative to that which would exist without the rugged inner peripheries.

Figure 8:
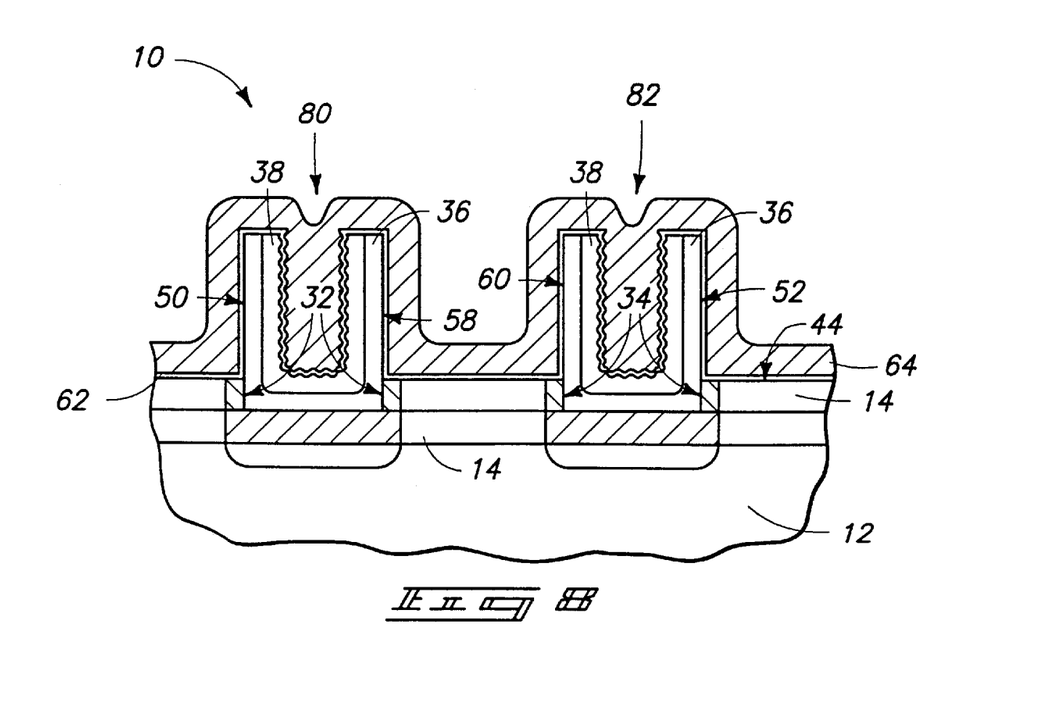
FIG. 8 is a view of the FIG. 1 wafer fragment shown at a processing step subsequent to that of FIG. 7.

Referring to FIG. 8, container structures 50 and 52 are shown incorporated into capacitor constructions 80 and 82, respectively. Specifically, a dielectric material 62 is shown formed along the inner and outer peripheries of the container structures; and a conductive material 64 is shown formed over dielectric material 62. Container construction 50, in combination with dielectric material 62 and conductive material 64 defines capacitor construction 80; and capacitor structure 52 in combination with dielectric material 62 and conductive material 64 defines capacitor construction 82. Dielectric material 62 can comprise conventional capacitor dielectric materials, such as, for example, silicon dioxide and/or silicon nitride; and conductive material 64 can comprise any of numerous conductive materials, including, for example, metal and/or conductively doped silicon.

Capacitor constructions 80 and 82 can be incorporated into various semiconductor circuitry applications. In particular embodiments, capacitors 80 and 82 can be an electrical connection with transistor gates (not shown), and accordingly can be incorporated into DRAM cells.

Although silicon-containing layer 38 was initially provided with a relatively low concentration of conductivity-enhancing dopant compared to silicon-comprising material 36, it can be desired that the dopant concentration within the material 38 be increased when the material is incorporated as part of a electrode in a capacitor construction. Such increase in dopant concentration can be accomplished by implanting dopant into material 38 prior to incorporation of material 38 into a capacitor construction, and/or by outdiffusion of dopant from heavily doped material 36 into material 38. Accordingly, in particular embodiments the materials 36 and 38 incorporated into capacitor constructions 80 and 82 can have about the same concentration of conductivity-enhancing dopant as one another. Alternatively, in other particular embodiments the amount of conductivity-enhancing dopant in material 36 can remain somewhat higher than the concentration in material 38 in the capacitor constructions, provided that material 38 is sufficiently electrically conductive to function as a part of a capacitor electrode.

A second embodiment of the invention is described with reference to FIGS. 9–13. In referring to FIGS. 9–13, identical numbering will be used as was utilized above in describing FIGS. 1–8, where appropriate.

Figure 9:
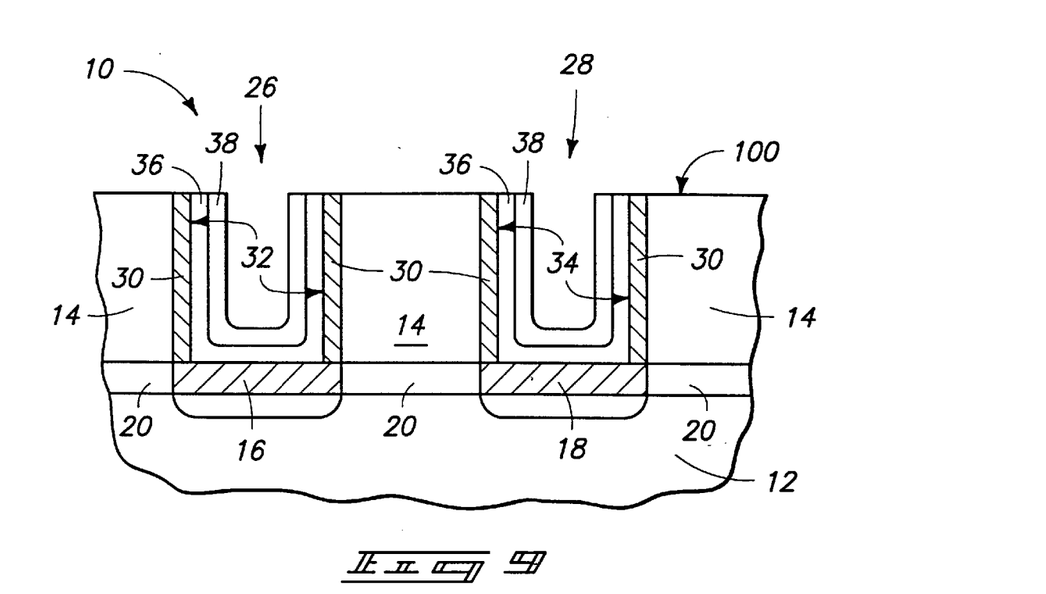
FIG. 9 is a diagrammatic, cross-sectional view of a semiconductor wafer fragment shown at a processing step in accordance with a second embodiment method of the present invention. The processing step of FIG. 9 follows the processing step of FIG. 3.

Referring initially to FIG. 9, wafer fragment 10 is illustrated at a processing step subsequent to that described above with reference to FIG. 3. The layers 36 and 38 described with reference to FIG. 3 have been removed from over mass 14. A suitable method for removing layers 36 and 38 from over mass 14 is planarization, such as, for example, chemical-mechanical polishing. Such planarization forms a substantially planar upper surface 100 extending across mass 14, and layers 30, 36 and 38. Upper surface 100 can be at a same elevational level as was an initial upper surface of mass 14 (with such initial upper surface being shown as surface 15 in FIG. 3), or can be elevationally lower than surface 15 if some of mass 14 is removed during the planarization process.

Figure 10:
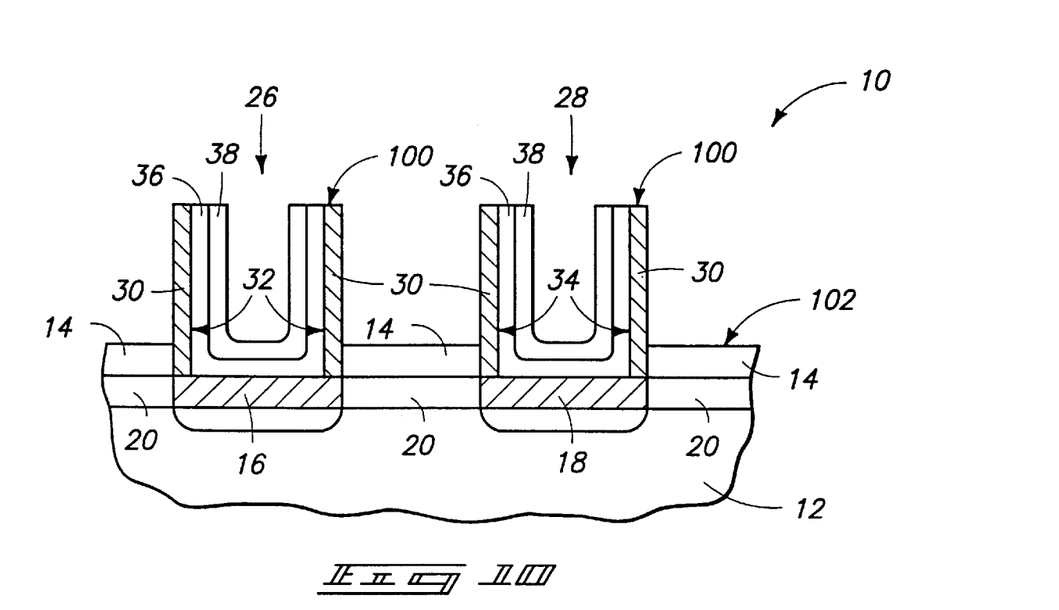
FIG. 10 is a view of the FIG. 9 wafer fragment shown at a processing step subsequent to that of FIG. 9.

Referring to FIG. 10, some of mass 14 is selectively removed relative to layers 30, 36 and 38. Such selective removal can be accomplished utilizing processing similar to that discussed above with reference to FIG. 6. The removal of some of mass 14 forms a new upper surface 102 of mass 14 which is lowered relative to planarized upper surface 100, and exposes some of sacrificial material 30.

Figure 11:
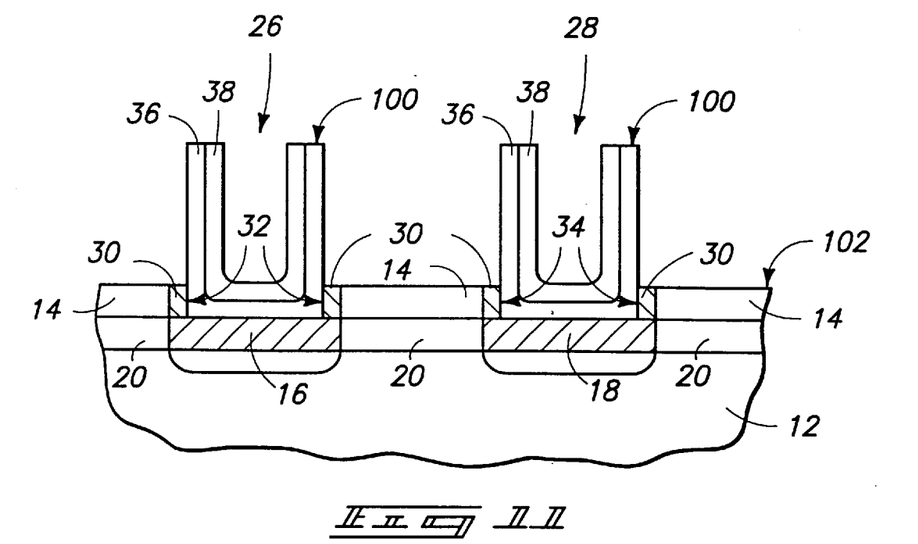
FIG. 11 is a view of the FIG. 9 wafer fragment shown at a processing step subsequent to that of FIG. 10.

Referring to FIG. 11, the exposed portion of sacrificial material 30 is selectively removed relative to mass 14 and silicon-containing layers 36 and 38. Such selective removal of sacrificial material 30 can be accomplished with processing similar to that described above with reference to FIG. 7. It is noted that even though an entirety of the exposed portion of sacrificial material 30 is illustrated as being removed in the shown preferred embodiment, the invention encompasses other embodiments (not shown) wherein only some of the exposed portion of material 30 is removed.

Figure 12:
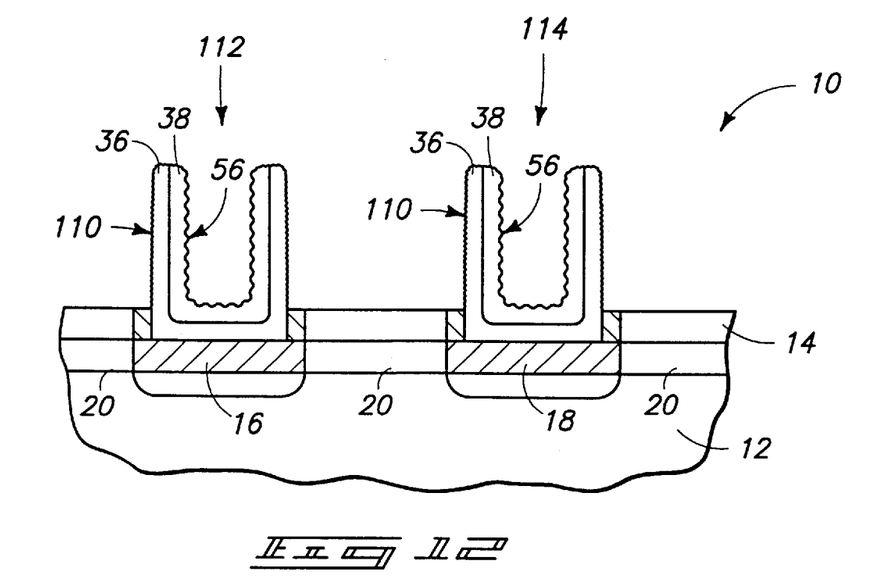
FIG. 12 is a view of the FIG. 9 wafer fragment shown at a processing step subsequent to that of FIG. 11.

Referring to FIG. 12, wafer fragment 10 is illustrated after exposure to conditions suitable for forming rugged surface 56 across exposed portions of silicon-containing material 38. Suitable conditions can be identical to those described previously with reference to FIG. 4. It is noted that such conditions also form a rugged silicon surface 110 across exposed portions of silicon-containing material 36. However, since silicon-containing material 36 comprises a higher concentration of dopant than does silicon-containing material 38, the rugged surface 110 is less rugged than is rugged surface 56. In other words, even though both surface 110 and surface 56 can be considered to comprise hemispherical grain silicon, the average grain size across surface 110 is less than the average grain size across surface 56. In particular embodiments, a maximum grain size across surface 110 will also be less than a maximum grain size across surface 56.

Layers 36 and 38 form container structures 112 and 114 over plugs 16 and 18, respectively. The container structures have an outer periphery defined by roughened surface 110 and an inner periphery defined by roughened surface 56. The outer periphery is smoother than the inner periphery, in that the outer periphery has a surface which is less roughened than the inner periphery.

Figure 13:
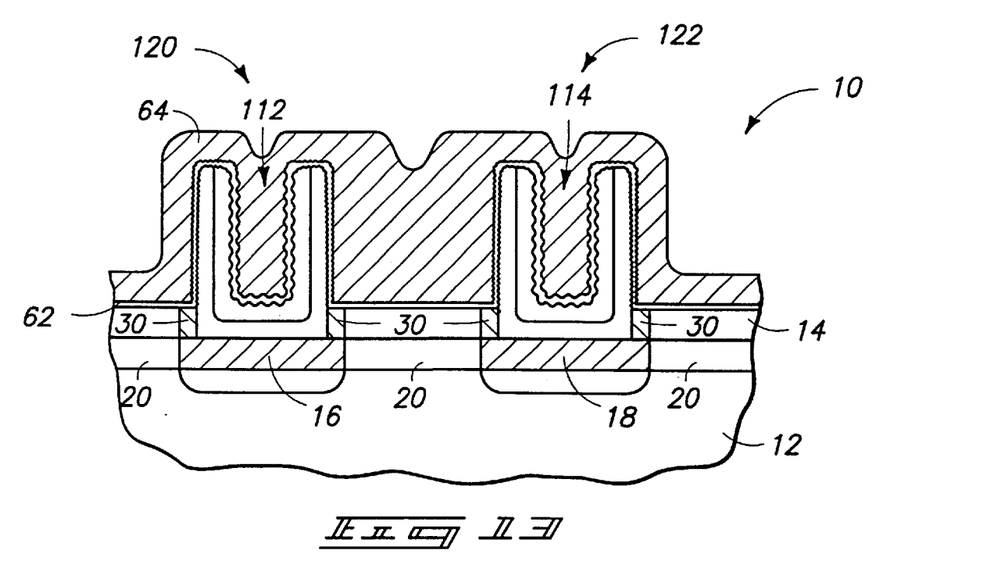
FIG. 13 is a view of the FIG. 9 wafer fragment shown at a processing step subsequent to that of FIG. 12.

Referring to FIG. 13, dielectric material 62 and conductive material 64 are formed over container constructions 112 and 114 to form capacitor structures 120 and 122 from the container structures 112 and 114, respectively. An advantage of having the outer peripheral surfaces of containers 112 and 114 less roughened than the inner peripheral surfaces is that such can enable capacitor structures 112 and 114 to be formed closer together than could be accomplished if the outer peripheral surfaces were as rough as the inner peripheral surfaces. Yet, the roughened inner peripheral surfaces enable a large surface area to be attained, which can improve capacitive properties associated with capacitors 120 and 122 relative to those which would occur if less roughened inner surfaces were utilized. Accordingly, capacitor structures 120 and 122 have the advantage of being suitable for being formed in close proximity to one another, while retaining advantages associated with roughened electrode surfaces.

Capacitors 120 and 122 can be referred to as dual-sided container capacitor constructions, in that the capacitive relationship of the capacitor materials are maintained across both the inner and outer peripheries of the containers.

An advantage of leaving the remnant of material 30 at a base of container structures 112 and 114 is that such can eliminate a so-called "sink-hole" problem which can otherwise occur during an etch-back of material 14. Specifically, if material 14 were etched entirely back to a base of plugs 16 and 18, and if conductive material 30 were then etched back to a level of plugs 16 and 18, there would occasionally be incongruities introduced at surfaces of plugs 16 and 18. Such incongruities are frequently referred to as "sink-holes." However, by leaving a portion of material 30 remaining in the shown preferred embodiment, such sink-holes can be avoided.

Another embodiment of the invention is described with reference to FIGS. 14–16. In referring to FIGS. 14–16, similar numbering will be used as was used above in describing FIGS. 1–13, as appropriate.

Figure 14:
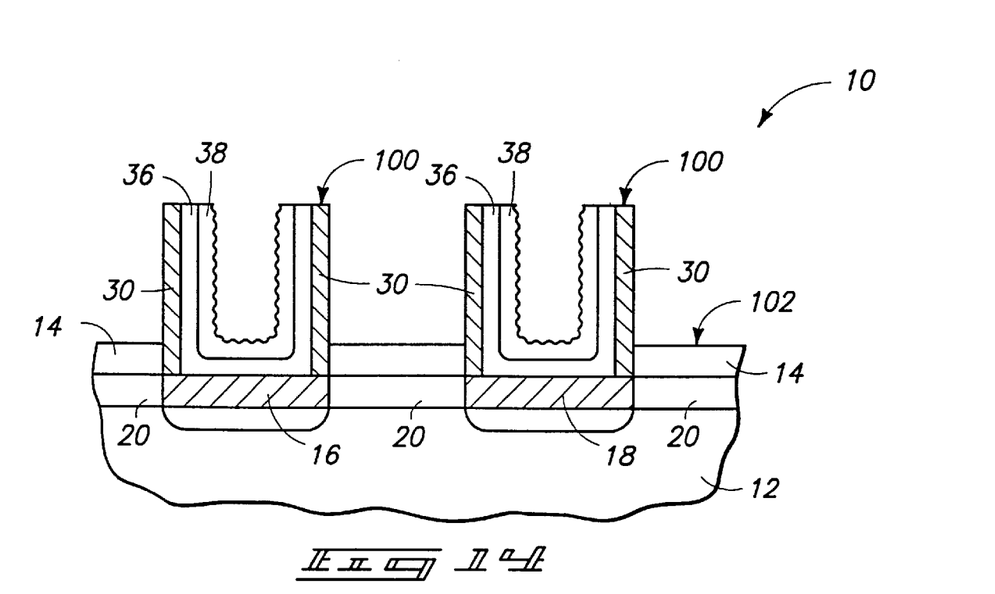
FIG. 14 is a diagrammatic, cross-sectional view of semiconductor wafer fragment processed in accordance with a third embodiment method of the present invention. The processing step of FIG. 14 follows the step illustrated in FIG. 10.

Referring initially to FIG. 14, semiconductor fragment 10 is illustrated at a processing step subsequent to that of FIG. 10. Specifically, mass 14 has been etched back to form an upper surface 102 which is lower than the planarized upper surface 100 of layers 30, 36 and 38. After such removal of a portion of mass 14, fragment 10 is exposed to conditions which roughen an exposed surface of silicon-containing layer 38. Such conditions can be identical to those described above with reference to FIG. 7.

Figure 15:
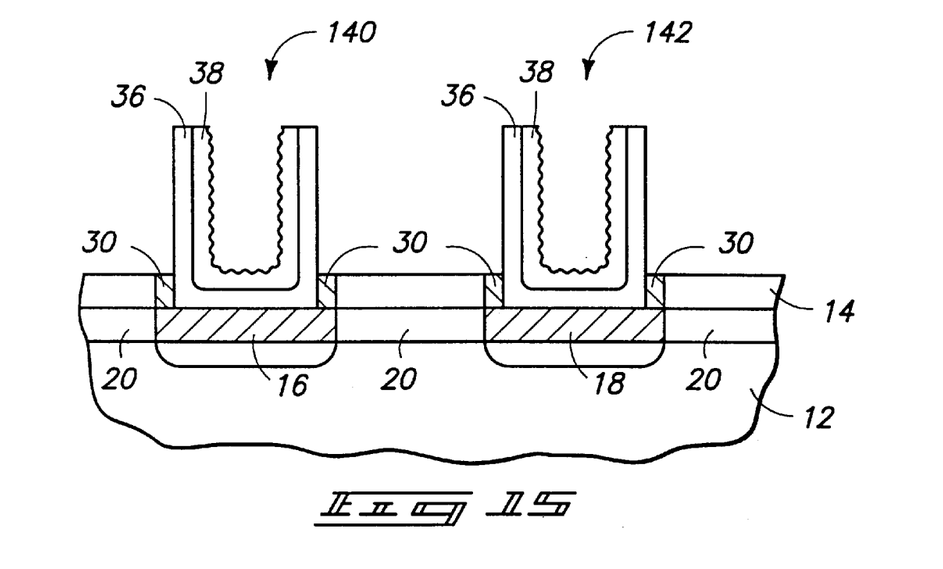
FIG. 15 is a view of the FIG. 14 wafer fragment shown at a processing step subsequent to that of FIG. 14.

Referring to FIG. 15, exposed portions of material 30 are removed to leave container shapes 140 and 142 comprising silicon-containing layers 36 and 38. Container constructions 140 and 142 comprise a relatively smooth outer peripheral surface corresponding to an exposed surface of silicon-containing material 36; and a rugged inner peripheral surface corresponding to an exposed surface of silicon-containing 38.

Figure 16:
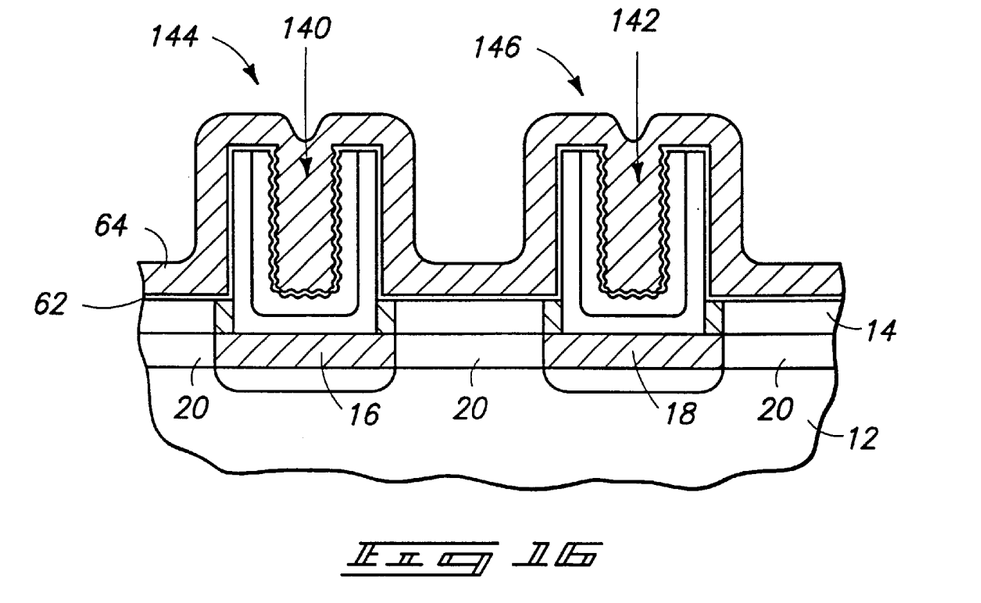
FIG. 16 is a view of the FIG. 14 wafer fragment shown at a processing step subsequent to that of FIG. 15.

Referring to FIG. 16, dielectric material 62 and conductive material 64 are formed across the container shapes 140 and 142 to form capacitor constructions 144 and 146.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a capacitor structure, comprising:
   providing a substrate having an electrical node supported thereby;
   forming an insulative mass over the electrical node;
   forming an opening extending through the insulative mass to the electrical node; the opening having a periphery which includes at least one sidewall;
   forming a first layer along the at least one sidewall of the opening;
   forming a second layer along first layer; the second layer comprising silicon which is doped with a conductivity-enhancing dopant; forming a third layer along the second layer; any concentration of conductivity-enhancing dopant in the third layer being less than the concentration of conductivity-enhancing dopant in the second layer;
   removing some of the insulative mass to expose at least a portion of the first layer;
   removing at least some of the exposed portion of the first layer to expose at least some of the second layer;
   converting at least some of the third layer to hemispherical grain silicon;

forming a dielectric material along the third layer and exposed portion of the second layer; and forming a conductive material over the dielectric material; the second layer, third layer, dielectric material and conductive material together defining at least part of the capacitor structure.

2. The method of claim 1 wherein the first layer comprises a metal.

3. The method of claim 1 wherein the second layer comprises a dopant concentration of at least $10^{20}$ atoms/cm$^3$.

4. The method of claim 1 wherein the second layer comprises a dopant concentration that is at least $10^3$ fold higher than any dopant concentration in the third layer.

5. The method of claim 1 wherein the second layer comprises a dopant concentration that is at least $10^5$ fold higher than any dopant concentration in the third layer.

6. The method of claim 1 wherein the second layer comprises a dopant concentration that is at least $10^{10}$ fold higher than any dopant concentration in the third layer.

7. The method of claim 1 wherein the converting occurs before the removing at least some of the exposed portion of the first layer.

8. The method of claim 1 wherein the converting occurs after the removing at least some of the exposed portion of the first layer.

9. The method of claim 1 wherein the converting occurs after the removing at least some of the exposed portion of the first layer and wherein the converting further comprises converting at least some of the second layer to hemispherical grain silicon during the conversion of the at least some of the third layer to hemispherical grain silicon.

10. The method of claim 1 wherein the converting occurs before the removing of some of the insulative mass.

11. The method of claim 1 wherein the converting occurs after the removing of some of the insulative mass.

12. The method of claim 1 wherein the converting occurs after the removing of some of the insulative mass and before the removing at least some of the exposed portion of the first layer.

* * * * *